United States Patent [19]

Kudo et al.

[11] Patent Number: 4,918,583

[45] Date of Patent: Apr. 17, 1990

[54] ILLUMINATING OPTICAL DEVICE

[75] Inventors: Yuji Kudo, Yokohama; Koichi Matsumoto, Tokyo, both of Japan

[73] Assignee: Nikon Corporation, Tokyo, Japan

[21] Appl. No.: 340,444

[22] Filed: Apr. 19, 1989

[30] Foreign Application Priority Data

Apr. 25, 1988 [JP] Japan .................................. 63-101925
Aug. 11, 1988 [JP] Japan .................................. 63-200922

[51] Int. Cl.$^4$ .............................................. F21V 7/04
[52] U.S. Cl. ..................................... 362/268; 362/32; 350/167
[58] Field of Search ................... 362/32, 268, 259; 350/6.6, 167, 574, 576

[56] References Cited

U.S. PATENT DOCUMENTS

| | | | |
|---|---|---|---|
| 4,476,519 | 10/1984 | Hayamizu | 362/32 |
| 4,619,508 | 10/1986 | Shibuya et al. | 362/268 |
| 4,656,562 | 4/1987 | Sugino | 362/268 |
| 4,683,524 | 7/1987 | Ohta | 362/268 |
| 4,769,750 | 9/1988 | Matsumoto et al. | 350/167 |
| 4,787,013 | 11/1988 | Sugino et al. | 362/268 |
| 4,851,978 | 7/1989 | Ichihara | 350/167 |

FOREIGN PATENT DOCUMENTS 0226317 12/1984 Japan ................................. 350/167

Primary Examiner—Ira S. Lazarus
Assistant Examiner—Sue Hagarman
Attorney, Agent, or Firm—Shapiro and Shapiro

[57] ABSTRACT

An illuminating optical device having an optical integrator capable of receiving a light flux from a light source and substantially forming a plane light source comprising a plurality of light source images and uniformly illuminating an object includes a square-pillar-like internal reflection type integrator having a plurality of reflecting surfaces capable of reflecting the light flux from the light source and forming a plurality of virtual images of the light source on a plane near the entrance surface thereof, a fly-eye type integrator comprising a plurality of lens elements receiving the light flux from the light source and capable of forming a plurality of light source images on a plane, the lens elements being juxtaposed in proximity to one another, and relay lens means provided between the two integrators so that the exit surface of one of the two integrators which is adjacent to the light source and the entrance surface of the other integrator which is adjacent to the object are substantially conjugate with each other.

17 Claims, 8 Drawing Sheets

ILLUMINATING OPTICAL DEVICE

BACKGROUND OF THE INVENTION

1. Field of the Invention

This invention relates to an illuminating optical device for uniformly illuminating an object, and in particular to an illuminating optical device suitable for an exposure apparatus for manufacturing semiconductive chips such as IC, LSI and VLSI.

2. Related Background Art

As an illuminating optical device used in an exposure apparatus of this type, a construction using an optical integrator is well known. In such a construction, however, the degree of achievement of the uniformity of illumination distribution is not always satisfactory and further, the uniformity of the illumination distribution outside a surface to be irradiated is remarkably inferior. Therefore, where such an illuminating optical device is used as the illuminating system of a projection type exposure apparatus (a stepper), there has been the difficulty that the resolving power and the depth of focus of the projecting lens are deteriorated. In order to eliminate such a difficulty, an illuminating optical device of a construction in which fly-eye type integrators are used in two stages is patented as U.S. Pat. No. 4,497,015 issued to the applicant.

The construction disclosed in this U.S. Pat. No. 4,497,015 is shown in FIG. 14 of the accompanying drawings. In FIG. 14, a light source 1 is disposed so that the light emitting point thereof coincides with the vicinity of a first focus of an elliptical mirror 2, and a condensing point (the light source image) is formed in the vicinity of a second focus (a surface A1). A light flux passed through the condensing point is substantially collimated by a positive lens 3 and enters a first fly-eye type integrator 4. Two positive lenses 5 and 6 are disposed between the first fly-eye type integrator 4 and a second fly-eye type integrator 7, and the first and second fly-eye type integrators 4 and 7 are constructed so that their entrance surfaces (surfaces B1 and B2) are conjugate with each other and their exit surfaces (surfaces A2 and A3) are conjugate with each other. The light flux which has left the second fly-eye type integrator 7 uniformly illuminates a surface 0 to be irradiated through a field lens 8 and a condenser lens 9.

What has been described above is the basic construction disclosed in the aforementioned U.S. Patent, and in FIG. 14, surfaces which are in a conjugate relation with the light source 1 are designated by reference characters A1, A2 and A3, and surfaces which are in a conjugate relation with the surface 0 to be irradiated are denoted by reference characters B1 and B2.

In the prior-art device of the construction as shown in FIG. 14, fly-eye type integrators are used in two stages and therefore, an increase in the number of fly-eye lens elements constituting the fly-eye type integrators is unavoidable, and the increase in the number of parts has led to the problem that the steps of manufacture and the cost of manufacture are increased.

Also, where use is made of a light source of very high output such as an excimer laser, there has been the fear that optical elements are destroyed by the heat generation at the condensing point.

SUMMARY OF THE INVENTION

Accordingly, it is an object of the present invention to provide an illuminating optical device which is small in number of parts and simple in construction and yet capable of accomplishing uniform illumination.

It is another object of the present invention to provide an illuminating optical device which is small in number of parts and simple in construction and yet capable of accomplishing uniform illumination even when a laser is used as the light source and in which optical elements may not be damaged even when use is made of a laser source of high output such as an excimer laser.

The present invention basically is an illuminating optical device having two optical integrators for receiving a light flux from a light source and forming a substantial plane light source comprising a plurality of light source images, and one of the two optical integrators is a square-pillar-like internal reflection type integrator and the other is a fly-eye type integrator comprising a plurality of juxtaposed lenses. A relay lens is disposed between the two integrators, and the exit surface of the integrator which is adjacent to the light source and the entrance surface of the other integrator are formed optically substantially conjugately with each other.

Further, it is desirable that the entrance surface of the integrator which is adjacent to the light source and the exit surface of the other integrator be formed optically substantially conjugately with each other.

Where is such a basic construction, the square-pillar-like internal reflection type integrator is disposed on the light source side, each integrator and the relay lens are disposed so that the condensing point of the real image or the virtual image of the light flux from the light source is formed near the entrance surface of the square-pillar-like internal reflection type integrator and further, by the relay lens, the entrance surface of the square-pillar-like internal reflection type integrator and the exit surface of the fly-eye type integrator are substantially conjugate with each other and at the same time, the exit surface of the square-pillar-like internal reflection type integrator and the entrance surface of the fly-eye type integrator are substantially conjugate with each other. Thereby, a substantial plane light source is formed on the exit surface of the fly-eye type integrator. Also, in this case, it is effective to provide a condenser lens between the fly-eye type integrator and the surface to be irradiated so that the entrance surface of the fly-eye type integrator is formed substantially conjugately with the surface to be irradiated.

On the other hand, where the fly-eye type integrator is disposed on the light source side, each integrator and the relay lens are disposed so that the light flux from the light source is condensed near the exit surface of the fly-eye type integrator and by the relay lens, the exit surface of the fly-eye type integrator and the entrance surface of the square-pillar-like internal reflection type integrator are formed so as too be substantially conjugate with each other and at the same time, the entrance surface of the fly-eye type integrator and the exit surface of the square-pillar-like internal reflection type integrator are substantially conjugate with each other. Also, in this case, it is effective to provide a condenser lens between the square-pillar-like internal reflection type integrator and the surface to be irradiated so that the exit surface of the internal reflection type integrator is substantially conjugate with the surface to be irradiated.

Also, even where use is made of a collimated light flux like a laser source, the present invention basically is an illuminating optical device having two optical integrators disposed in series with a relay lens interposed therebetween to receive the light from light source means and form a substantial plane light source comprising a plurality of condensing points. A fly-eye type integrator comprising a plurality of juxtaposed positive or negative lenses is used as one of the two optical integrators, and a square-pillar-like internal reflection type integrator is used as the other integrator disposed with the relay lens interposed between the two optical integrators.

In this case, where the first stage fly-eye type integrator is constructed by a plurality of juxaposed positive lens elements, it is necessary to construct it so that the rearward focus position of each positive lens element is within the rearward space spaced apart from said positive lens element in order to avoid the influence of the heat of the converging portion. the present invention is also constructed so that by the relay lens disposed between the two integrators, the condensing point of a plurality of real images or virtual images formed by the fly-eye type integrator on the light source side and the vicinity of the entrance surface of the square-pillar-like internal reflection type integrator as the second stage integrator are in a conjugate relation with each other.

According to the present invention of the construction as described above, the use of an internal reflection type integrator leads to a reduced number of parts and thus a simple construction, and this in turn leads to the possibility of minimizing the manufacturing cost and the possibility of displaying a performance equal to that of an illuminating optical system using a plurality of fly-eye type integrators. Moreover, even where use is made of a laser source of high output such as an excimer laser, the possibility of the optical elements being damaged is small. Specifically, the present invention is excellent in the uniformity of illumination on the surface to be irradiated and is also improved in the uniformity of illumination on the other surface than the surface to be irradiated such as the light source surface and therefore, is suitable as an illuminating optical system for a projection type exposure apparatus using a laser as a light source. The present invention is also applicable to other laser illuminating optical device of which highly accuate uniformity of illumination is required.

Other objects, features and effects of the present invention will become fully apparent from the following detailed description taken in conjunction with the accompanying drawings.

DESCRIPTION OF THE PREFERRED EMBODIMENTS

Some embodiments of the present invention will hereinafter be described with reference to the drawings.

Figure 1:
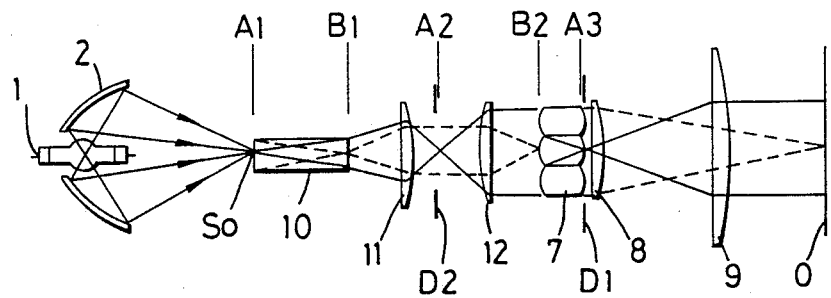
FIG. 1 shows the construction of a first embodiment of the present invention and the schematic optical path thereof.
Figure 3:
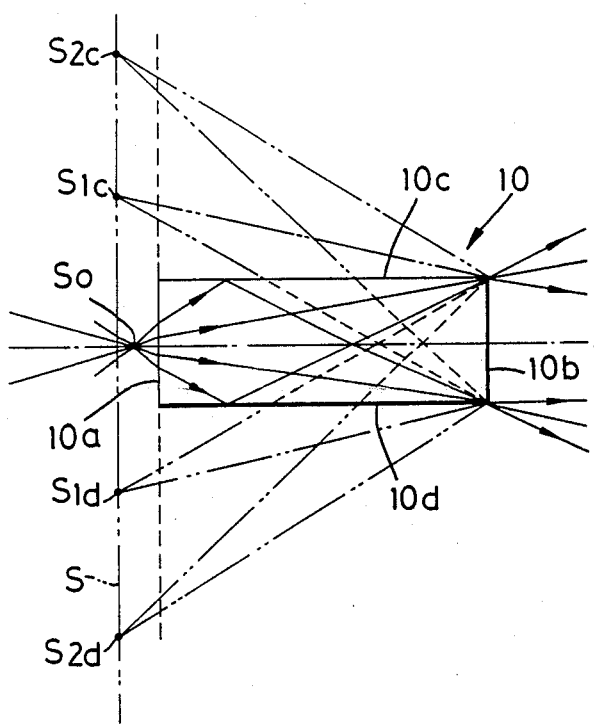
FIG. 3 illustrates the optical path of the square-pillar-like internal reflection type integrator shown in FIG. 2.
Figure 4:
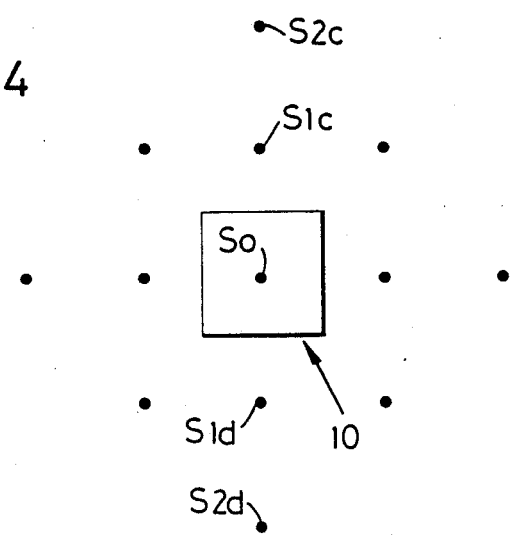
FIG. 4 shows the light source image distribution of a substantial plane light source formed by the square-pillar-like internal reflection type integrator shown in FIG. 2.

FIG. 1 is a schematic optical path diagram showing a first embodiment of an illuminating optical system using a square-pillar-like internal reflection type integrator as a first optical integrator and using a fly-eye type integrator as a second optical integrator. A super-high pressure mercury lamp 1 as a light source is disposed on a first focus of an elliptical mirror 2, and a light flux from the super-high pressure mercury lamp 1 is condensed on a second focus So of the elliptical mirror 2, as indicated by solid lines in FIG. 1, and enters a square-pillar-like internal reflection type integrator 10 disposed so as to have an entrance surface A1 near the second focus So of the elliptical mirror 2. The light flux which has entered the square-pillar-like internal reflection type integrator 10 emerges therefrom by the internal reflection on the side surface thereof as is a number of light sources were present on a plane near the entrance surface A1 of the square-pillar-like internal reflection type integrator 10, as shown in FIG. 3, and a substantial plane light source is formed near the entrance surface A1, as shown in FIG. 4.

Figure 2:
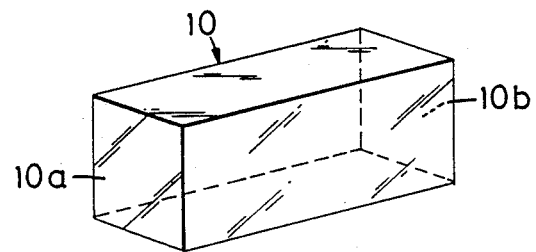
FIG. 2 is a perspective view of a square-pillar-like internal reflection type integrator forming the essential portion of the first embodiment shown in FIG. 1.

The square-pillar-like internal reflection type integrator will now be described in detail. This internal reflection type integrator 10 is a transparent optical member of a shape like a square pillar as shown in FIG. 2, and its inner surface provides a reflecting surface. FIG. 3 schematically shows the cross-sectional optical path of the square-pillar-like internal reflection type integrator along the optic axis. As shown, of the light fluxes entering the entrance surface $10a$ of the square-pillar-like integrator from a light source image So formed near the entrance surface $10a$, the paraxial light flux travelling along the optic axis emerges while being slightly refracted by the entrance surface $10a$ and the exit surface $10b$, and the light flux travelling with a great inclination and reflected by the upper side surface $10c$ of the square-pillar-like integrator emerges from the exit surface $10b$ as if it were supplied from a virtual light source image $S_{1c}$ conjugate with the light soruce image So with respect to the upper side surface $10c$. Likewise, the light flux reflected by the lower side surface $10d$ of the square-pillar-like integrator emerges from the exit surface $10b$ as if it were supplied from a virtual light source image $S_{1d}$ conjugate with the light source image So with respect to the lower side surface $10d$. The light flux reflected by the lower side surface $10d$ and thereafter reflected by the upper side surface $10c$ emerges as if it were supplied from a virtual light source image $S_{2c}$, and the light flux reflected by the upper side surface $10c$ and thereafter reflected by the lower side surface 10d emerges as if it were supplied from a virtual light source image $S_{2d}$. Accordingly, the divergent light flux from the light source image So which enters the square-pillar-like internal reflection type integrator emerges by one or more reflections on the side surface as if it were supplied from a number of light source images substantially on a plane. Where this square-pillar-like internal reflection type integrator 10 comprises, for example, a square pillar whose cross-sectional shape is square as shown in the perspective view of FIG. 2, the state of the light source image as viewed from the exit surface 10b is made such by the reflection on each side surface that the exit surface 10b is illuminated by the light fluxes from a number of light sources distributed in the form of a grating, as shown in FIG. 4, and a substantial plane light source is formed on the surface S on which these light source images are formed.

In the foregoing description, a construction has been adopted in which the condensing point of a real image is formed near the entrance surface 10a of the square-pillar-like internal reflection type integrator 10, but in the case of a light source emitting a parallel light flux such as a laser, a negative lens may be used instead of the positive lens for condensing light on the entrance surface of the integrator 10, to form the condensing point of a virtual image near the entrance surface of the square-pillar-like internal reflection type integrator.

Thus, by forming a real or virtual light source image near the entrance surface of a member of very simple construction such as a single square pillar by the use of such member, it becomes possible to form a substantial plane light source near the entrance surface, and it becomes possible to realize an illuminating optical device of simple construction which is capable of accomplishing uniform illumination by a combination thereof with the fly-eye integrator 7, as described above.

Also, as a fly-eye type integrator, there is one comprising a pair of lens elements disposed in spaced apart relationship with each other by a distance substantially equal to the focal length, as is known from U.S. Pat. No. 3,296,923 and Japanese Laid-Open Patent Application No. 56-81813, but such integrator may also be constructed by bundling up bar-like lenses having a length substantially equal to the focal length, and it is also possible to construct such integrator by combining two sets of fly-eye lenses spaced apart from each other by a distance corresponding to the focal length.

Relay lenses 11 and 12 are disposed between the fly-eye type integrator 7 as the second optical integrator and the internal reflection type integrator 10 as the first optical integrator, whereby the exit surface B1 of the square-pillar-like internal reflection type integrator 10 and the entrance surface B2 of the fly-eye type integrator 7 are formed so as to be in a conjugate relation with each other, as indicated by broken lines. On the other hand, by the light source image being formed at the intermediate position A2 between the relay lenses 11 and 12 as indicated by solid line, the light flux from the internal reflection type integrator 10 is converted into a substantially parallel light flux by the relay lenses 11 and 12. Also, the entrance surface A1 of the square-pillar-like internal reflection type integrator 10 and the exit surface A3 of the fly-eye type integrator 7 are formed so as to be conjugate with each other and the secondary image of the light source is formed on the exit surface A3 of the fly-eye type integrator 7.

Here, as indicated by broken lines in FIG. 1, of the relay lenses 11 and 12, the positive lens 11 as the first relay lens is designed to convert the light flux emerging from the exit surface B1 of the square-pillar-like internal reflection type integrator 10 into a substantially parallel light flux, and the positive lens 12 as the second relay lens is designed to condense that light flux on the entrance surface B2 of the fly-eye integrator 7. The constructions of the relay lenses 11 and 12 are not restricted thereto, but it is essential that the exit surface of the integrator which is adjacent to the light source and the entrance surface of the integrator which is adjacent to the surface to be irradiated are formed substantially conjugately with each other. In this first embodiment, a fly-eye type integrator is used as the second integrator and therefore, it is preferable that design be made such that the light flux from the light source is made into a parallel light flux by the relay lenses 11 and 12.

On the exit surface A3 of the fly-eye type integrator 7, a plurality of light source images by the internal reflection type integrator 10 as shown in FIG. 4 are formed on a reduced scale on the exit surfaces of the respective positive lens elements constituting the fly-eye type integrator 7, and light source images corresponding to the number nm of the product of the number m of the plurality of light source images by the square-pillar-like internal reflection type integrator 10 and the number n of the positive lens elements constituting the fly-eye type integrator 7 are formed on the whole of the exit surface A3, and a substantially uniform plane light source is formed on this surface A3. Here, the number m of the plurality of light source images by the square-pillar-like internal reflection type integrator 10 is determined by the angle of the light flux introduced by a subsequent optical system.

The light flux from the secondary light source image formed on the exit surface A3 of the fly-eye type integrator 7 is subjected to the action of a positive lens 8 as a field lens, and is further directed onto the surface 0 to be irradiated by a condenser lens 9. The field lens 8 serves to suppress the divergence of the marginal light flux and prevent the aperture of the condenser lens 9 from becoming great, and by this condenser lens 9, the entrance surface B2 of each of the positive lens elements constituting the fly-eye type integrator 7 is formed so as to be conjugate with the surface 0 to be irradiated. Thus, the entrance surfaces of the positive lens elements of the fly-eye type integrator 7 are projected in mutually superposed relationship on the surface 0 to be irradiated, and the surface 0 to be irradiated is superposedly illuminated by nm secondary light sources and very uniform illumination is obtained. It is desirable that the cross-sectional shape of the individual lens elements constituting the fly-eye type integrator be similar to the shape of the irradiated area on the surface to be irradiated, and in the case of a square irradiated area, it is desirable that the cross-sectional shape of the individual lens elements be a square.

In FIG. 1, the surfaces which are in a conjugate relation with the light source 1 are given reference characters A1, A2 and A3, and the surfaces which are in a conjugate relation with the surface 0 to be irradiated are given reference characters B1 and B2. Also, in the construction of the first embodiment, by providing a variable stop D1 near the exit surface A3 of the fly-eye type integrator 7 as the second optical integrator, of the surfaces conjugate with the light source, it is possible to make the numerical aperture (NA) of the illuminating light flux which irraidates the survace to be irradiated, and by providing a variable stop D2 on the surface A2 conjugate with the light source which is between the relay lenses 11 and 12, it is possible to change the quantity of light independently while keeping the numerical aperture (NA) of the light flux reaching the surface to be irradiated constant.

Figure 5:
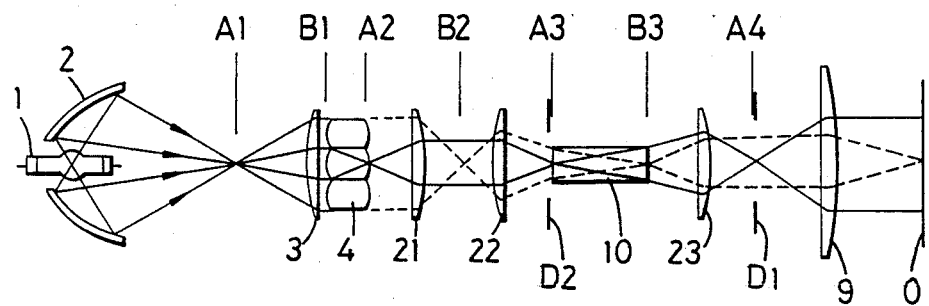
FIG. 5 shows the construction of a second embodiment of the present invention and the schematic optical path thereof.

FIG. 5 is a schematic optical path diagram showing a second embodiment of the present invention. In this embodiment, a fly-eye type integrator 4 is used as a first optical integrator, and a square-pillar-like internal reflection type integrator 10 is used as a second optical integrator. As in the first embodiment, a super-high pressure mercury lamp 1 is disposed on the first focus of an elliptical mirror 2, and a light flux from a light source is condensed on the second focus A1 of the elliptical mirror 2. The light flux passed through a condensing point (the second focus A1) is made into a substantially parallel light flux by a positivie lens 3, and enters the fly-eye type integrator 4 as the first optical integration, and a number of light source images equal to the number of fly-eye lens elements constituting the fly-eye type integrator are formed on the exit surface A2 thereof. The exit surface A2 of the fly-eye type integrator 4 and the entrance surface A3 of the internal reflection type integrator 10 are formed so as to be conjugate with each other by relay lenses 21 and 22 disposed between the fly-eye type integrator 4 and the square-pillar-like internal reflection type integrator 10 as the second optical integrator, and a plurality of light source images formed on the exit surface of the fly-eye eye type integrator 4 are re-imaged near the entrance surface of the internal reflection type integrator 10.

By the internal reflection type integrator 10, a plurality of light source images are formed near the entrance surface A3 of the internal reflection type integrator 10 in the same manner as described in connection with FIGS. 3 and 4. The number of the light source images on this entrance surface A3 is equal to the product mn of the number n of lens elements constituting the fly-eye type integrator 4 and the number m of virtual images formed by the reflection on the inner surface of the internal reflection type integrator 10, and a substantially uniform plane light source is formed.

Here, as indicated by solid lines in FIG. 5, the light flux from the exit surface A2 of the fly-eye type integrator 4 is converted into a substantially parallel light flux by the positive lens 21 as the first relay lens of the relay lenses 21 and 22, and is condensed on the entrance surface A3 of the internal reflection type integrator 10 by the positive lens 22 as the second relay lens, whereas this is not restrictive, but in short, the exit surface of the integrator which is adjacent to the light source and the entrance surface of the integrator which is adjacent to the surface to be irraidated can be formed conjugately with each other.

The light flux from the light source image formed near the entrance surface of the internal reflection type integrator 10 is once condensed by a positive lens 23, and thereafter is directed onto the surface 0 to be irradiated by a condenser lens 9. Further, the exit surface B3 of the internal reflection type integrator 10 and the surface 0 to be irradiated are constructed so as to be substantially conjugate with each other by the positive lens 23 and the condenser lens 9, and the surface 0 to be irradiated is illuminated very uniformly.

In the construction of the second embodiment shown in FIG. 5, a stop D1 for adjusting the numerical aperture (NA) of the illuminating light can be provided on a surface A4 conjugate with the light source which is between the positive lens 23 and the condenser lens 9. Also, a stop D2 for adjusting the quantity of light while maintaining the numerical aperture (NA) of the illuminating light can be provided on the exit surface A2 of the fly-eye type integrator 4 or the entrance surface A3 of the internal reflection type integrator 10.

In the above-described first and second embodiments, the super-high pressure mercury lamp 1 is used as the light source and the light flux therefrom is condensed by the elliptical mirror 2, but it is also possible to use a laser as the light source. Where a laser is used as the light source, the light flux from the laser is a substantially parallel light flux and therefore, the laser can be regarded as a substantial point source of light.

Where in the construction wherein the fly-eye type integrator is disposed on the light source side, the light source can be regarded as a substantial point source of light like a laser, it is possible to eliminate the lens action on the exit side of the fly-eye type integrator. Particularly where a laser of high output is used as the light source, it is effective to design the fly-eye type integrator such that the condensing position is formed in spaced apart relationship with the exit surface, as disclosed in the applicant's Japanese Patent Application No. 61-212064, in order to prevent integrator from being destroyed by the heat at the condensing position. The reason why in such a case, the exit surface of the fly-eye type integrator is disposed in a conjugate relation with the entrance surface of the internal reflection type integrator is that it is necessary to make a surface on which a plurality of condensing points lying strictly not on but near the exit surface of the fly-eye type integrator are formed. Accordingly, in the present invention, such a construction is also expressed as a construction in which the exit surface of the fly-eye type integrator and the entrance surface of the square-pillar-like internal reflection type integrator are substantially conjugate with each other.

Figure 6:
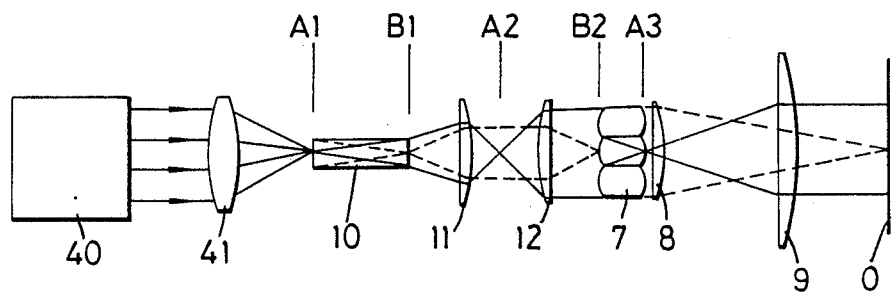
FIGS. 6, 7 and 8 show the constructions of third, fourth and fifth embodiments, respectively, of the present invention, and the schematic optical paths thereof.
Figure 7:
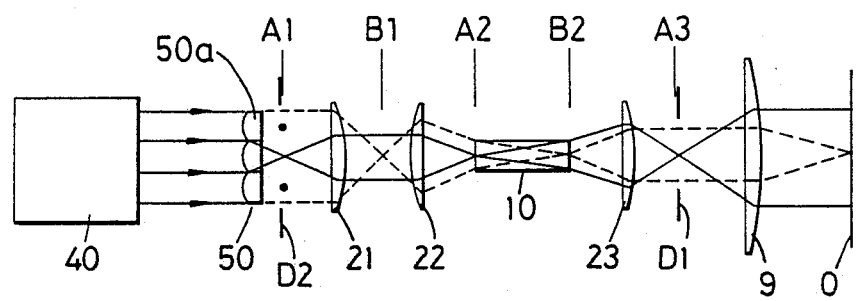

Third and fourth embodiments of the present invention shown in FIGS. 6 and 7, respectively, are illuminating optical devices using a laser as the light source. The third embodiment of FIG. 6 uses a square-pillar-like internal reflection type integrator 10 as a first optical integrator, and the fourth embodiment of FIG. 7 uses a fly-eye type integrator 7 as a first optical integrator.

In the third embodiment shown in FIG. 6, a parallel light flux from a laser source 40 is condensed near the entrance surface A1 of the internal reflection type integrator 10 by a positive lens 41, and the subsequent arrangement of the optical system is substantially the same as that of the first embodiment shown in FIG. 1. The laser source 40 includes, in addition to a laser, optical means such as a beam expander for enlarging the cross-sectional shape of the light flux from the laser to a desired size, and a beam expander having a cylindrical lens for converting a non-isotropic shape into an isotropic shape.

In the fourth embodiment shown in FIG. 7, the parallel light flux from the laser source 40 enters a fly-eye type integrator 50 as a first optical integrator. This fly-eye type integrator 50, as shown, has a lens surface of positive refractive power on the light source side thereof, and its exit surface is a flat surface, and a condensing point at which the light is condensed by the light source side lens surface is formed at a position spaced apart from the exit surface. Condensing points equal in number to lens elements constituting the fly-eye type integrator are formed on this surface A1. Further, by relay lenses 21 and 22 disposed between the fly-eye type integrator 50 and a square-pillar-like internal reflection type integrator 10 as a second optical integrator, the surface A1 on which the plurality of condensing points are formed and the entrance surface A2 of the internal reflection type integrator 10 are formed conjugately with each other with the aid of the fly-eye type integrator 50, and the plurality of condensing points formed by the fly-eye type integrator 50 are re-imaged near the entrance surface A2 of the internal reflection type integrator 10. Thereafter, as in the construction of the second embodiment shown in FIG. 5, a substantial plane light source is formed near the entrance surface A2 of the internal reflection type integrator 10. The light flux from the substantial plane light source formed near the entrance surface of the internal reflection type integrator 10 is once condensed on a surface A3 by a positive lens 23, whereafter it is directed onto the surface 0 to be irradiated by a condenser lens 9. The exit surface B2 of the internal reflection type integrator 10 and the surface 0 to be irradiated are made substantially conjugate with each other by the positive lens 23 and the condenser lens 9 and therefore, the surface 0 to be irradiated is illuminated very uniformly.

Figure 8:
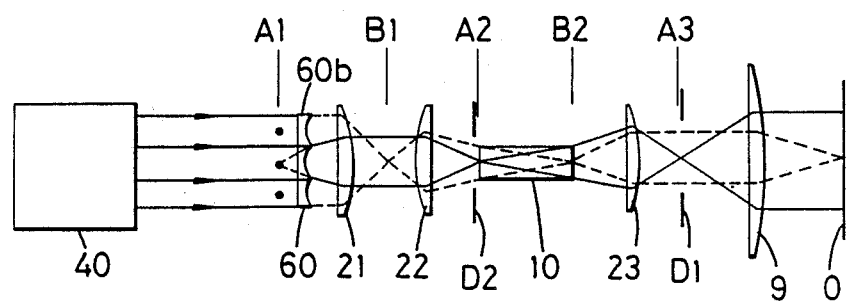

A fifth embodiment shown in FIG. 8 uses as a first optical integrator a fly-eye type integrator comprising a plurality of juxtaposed negative lens elements 60b, and is basically identical in construction to the fourth embodiment of FIG. 7.

Now, as in each embodiment described above, it is preferable that a real or virtual light source image be formed near the entrance surface of the internal reflection type integrator 10, and where the positive of the real light source image is made coincident with the entrance surface of the internal reflection type integrator 10, it is possible to make the aperture of the internal reflection type integrator 10 smallest. However, when the power of the light source is strong, there is the fear that the square-pillar-like internal reflection type integrator 10 is destroyed by the condensing heat. In such a case, it becomes necessary to dispose the condensing point at a position somewhat deviated from the entrance surface as shown in FIG. 3., or to form the condensing point of a virtual image by the use of a negative lens. Also, the shape of the internal reflection type integrator is not limited to the complete pillar-like shape as shown in FIGS. 2 and 3, but may be somewhat tapered to thereby change the widening angle (the numerical aperture: NA) of the emergent light flux. That is, the numerical aperture (NA) of the emergent light flux can be made great by constructing the side surface of the internal reflection type integrator 10 so as to narrow toward the emergence side of the light flux, and the numerical aperture (NA) of the emergent light flux can be made small by conversely constructing the side surface of the internal reflection type integrator 10 so as to widen toward the emergence side of the light flux. It is also possible to suitably endow the entrance surface or the exit surface of the internal reflection type integrator with a lens action.

Figure 9:
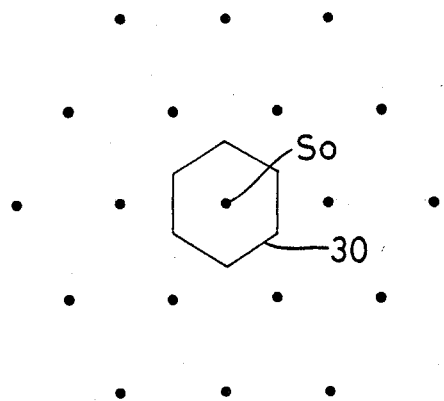
FIG. 9 shows the light source image distribution of a substantial plane light source formed by a hexagonal-pillar-like internal reflection type integrator.

Also, in any of the first to fourth embodiments described above, a square pillar of square cross-sectional shape is used as the internal reflection type integrator, whereas this is not restrictive, but the internal reflection type integrator may be of any cross-sectional shape such as an equilateral triangle or a regular hexagon in which the virtual images of the light source can be densely disposed on a plane. FIG. 9 shows the state of a substantial plane light source formed when a pillar-like internal reflection type integrator 30 of regular hexagonal cross-sectional shape is used as the internal reflection type integrator. FIG. 9, like FIG. 4, shows the entrance surface as seen from the exit surface of the internal reflection type integrator, and as shown there, a number of light source images (virtual images) are formed in the form of a hexagon relative to the central light source image (real image) in the internal reflection type integrator 30. Where such an internal reflection type integrator is used as the second optical integrator as shown in FIGS. 5 and 7, a plurality of light source images by the fly-eye type integrator are formed at the respective light source image positions of FIG. 9.

In the construction which satisfies the above-described conjugate relation in the first and second optical integrators, it is preferable that the shape of the exit surface of the first optical integrator be similar to the shape of the entrance surface of the second optical integrator which is in a conjugate relation therewith, and it is preferable that the shape of the entrance surface of the first optical integrator be similar to the shape of the exit surface of the second optical integrator which is in a conjugate relation therewith, and of course, this is small in the loss of the quantity of light and is effective to form a more uniform plane light source.

Figure 10:
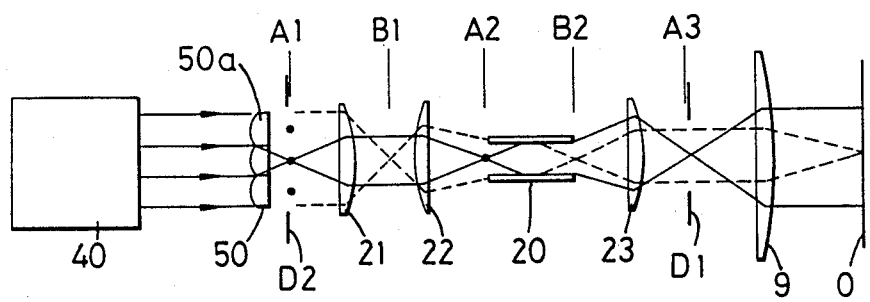
FIGS. 10 and 11 show the constructions of sixth and seventh embodiments, respectively, of the present invention and the schematic optical paths thereof.
Figure 11:
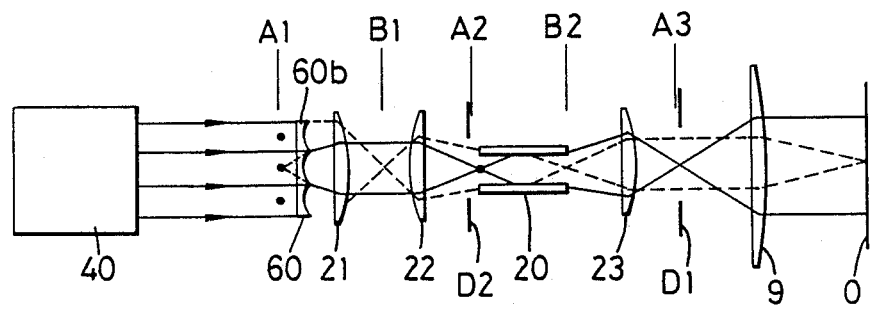

In any of the first to fifth embodiments described above, the square-pillar-like internal reflection type integrator 10 comprising a transparent glass rod is used as one optical integrator, but where a laser source of strong energy is used, it is desirable that as in embodiments shown in FIGS. 10 and 11, a hollow square-pillar-like internal reflection type integrator 20 be incorporated to thereby cope the condensing heat.

FIG. 10 is a schematic optical path diagram showing the construction of a sixth embodiment of the present invention. This sixth embodiment is an illuminating optical device using as the first optical integrator a fly-eye type integrator 50 comprising a plurality of juxtaposed positive lenses, and using an internal reflection type integrator 20 as the second optical integrator. A light flux supplied from light source means 40 is substantially collimated, and a plurality of condensing points are formed on a surface A1 in the exit side space by the fly-eye type integrator 50. The light source means 40 includes in addition to a laser, optical means such as a beam expander for enlarging the cross-sectional shape of the light flux from the laser to a desired size, and a beam expander having a cylindrical lens for converting a non-isotropic shape into an isotropic shape. The group of condensing points on the surface A1 is formed substantially conjugately with the entrance surface A2 of the square-pillar-like internal reflection type integrator 20 as the second optical integrator by relay lenses 21 and 22. The square-pillar-like internal reflection type integrator 20 in this sixth embodiment is a hollow square-pillar-like internal reflection type integrator shown in FIGS. 12 and 13. The conjugate relation between the group of condensing points on the surface A1 by the relay lenses 21 and 22 and the entrance surface A2 of the hollow internal reflection type integrator 20 need not be strict, but to efficiently introduce the light flux supplied from the group of condensing points on the surface A1 into the hollow square-pillar-like internal reflection type integrator 20, it is best to dispose them so that the conjugate relation as described above may be maintained.

The hollow square-pillar-like internal reflection type integrator 20 will now be described. The hollow internal reflection type integrator is an optical member which should be called an optical tunnel in which the inner surface of each side of a square or hexagonal pillar is formed into a reflecting surface.

Figure 12:
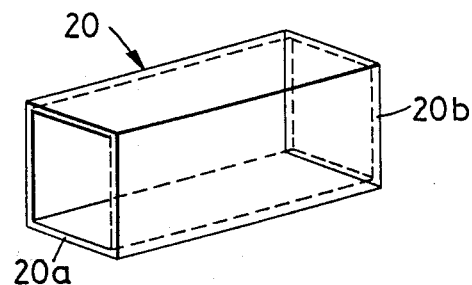
FIG. 12 is a perspective view of a hollow square-pillar-like internal reflection type integrator used in the sixth and seventh embodiments.
Figure 13:
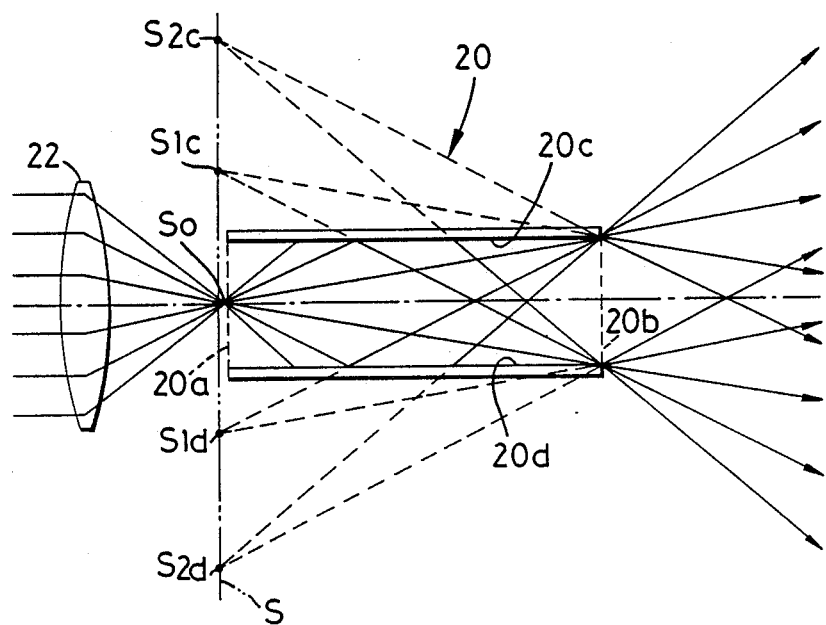
FIG. 13 illustrates the optical path of the internal reflection type integrator shown in FIG. 12.
Figure 14:
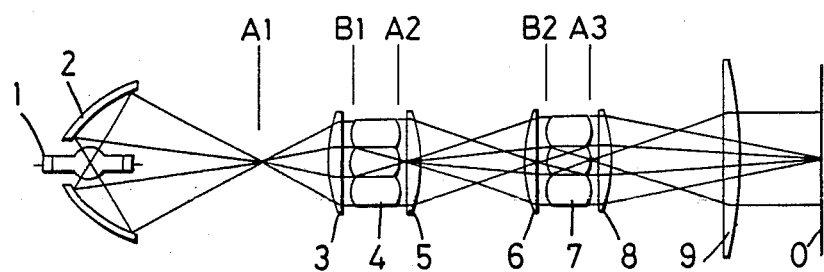
FIG. 14 shows the construction of an illuminating optical device according to the prior art and the schematic optical path thereof.

FIG. 12 shows a perspective view of an internal reflection type integrator of square cross-sectional shape as the hollow square-pillar-like internal reflection type integrator 20, and FIG. 13 is a cross-sectional view schematically showing the cross-sectional optical path along the optic axis to show the manner in which the light flux condensed by a positive lens 22 is reflected by the internal reflection type integrator 20 and emerges. As shown, each side of the hollow square pillar has its inner surface formed into a reflecting surface, and of the light fluxes entering from the light source image S0 formed near the entrance surface 20a of the hollow internal reflection type integrator 20, the light flux travelling along the optic axis intactly emerges from the exit surface 20b. The light flux reflected by the upper inner surface 20c in FIG. 13 emerges as if it were supplied from the condensing point $S_{1c}$ of the virtual image which is conjugate with the condensing point S0 with respect to the upper inner surface 20c, and likewise, the light flux reflected by the lower inner surface 20d emerges as if it were supplied from the condensing point $S_{1d}$ of the virtual image which is conjugate with the condensing point S0 with respect to the lower inner surface 20d. The light flux reflected by the lower inner surface 20d and thereafter reflected by the upper inner surface 20c emerges as if it were supplied from the condensing point $S_{2c}$ of the virtual image, and the light flux reflected by the upper inner surface 20c and thereafter reflected by the lower inner surface 20d emerges as is it were supplied from the condensing point $S_{2d}$ of the virtual image.

Accordingly, the divergent light flux from the condensing point S0 which enters the hollow square-pillar-like internal reflection type integrator 20 emerges by one or more reflections on the inner surface as if it were supplied a number of light source images substantially in a plane. For example, where the internal reflection type integrator is of a square cross-sectional shape as shown in the perspective view of FIG. 12, as in the square-pillar-like internal reflection type integrator 10 shown in FIG. 2, the state of the condensing point as seen from the exit surface by the reflection on each inner surface becomes such that as shown in the plan view of FIG. 4, the exit surface 20b is illuminated by the light fluxes from a number of condensing points distributed in the form of a grating, and a substantial plane light source is formed on a surface S on which these many condensing points of virtual images are formed.

In FIG. 10, the light flux which has entered the hollow square-pillar-like internal reflection type integrator 20 repeats internal reflection as shown in FIG. 13, and a substantial plane light source comprising a number of virtual images is formed near the entrance surface A2 of the hollow square-pillar-like internal reflection type integrator 20. At this time, the number of condensing points formed near the entrance surface A2 becomes equal to the product of the number of lens elements 50a constituting the fly-eye type integrator 50 and the number of the virtual images of the condensing points formed by the reflection on the inner surface of the hollow square-pillar-like internal reflection type integrator 20, and there is provided a very uniform plane light source in which a number of light source images are distributed substantially uniformly on a plane.

The light flux from the substantial plane light source formed near the entrance surface A2 by the hollow square-pillar-like internal reflection type integrator 20 is once condensed by a positive lens 23, whereafter it is directed onto the surface 0 to be irradiated by a condenser lens 9. That is, the exit surface B2 of the hollow square-pillar-like internal reflection type integrator 20 and the surface 0 to be irradiated are formed so as to be substantially conjugate with each other by the positive lens 23 and the condenser lens 9, whereby the surface 0 to be irradiated is illuminated uniformly.

In the construction of the sixth embodiment shown in FIG. 10, a stop D1 for adjusting the numerical aperture (NA) of the illuminating light may be disposed on the surface A3 between a positive lens 14 and a condenser lens 15. Also, a stop D2 for varying the quantity of the illuminating light may be disposed on a surface A1 on which a group of condensing points is formed by the fly-eye type integrator 50 or near the entrance surface A2 of the hollow square-pillar-like internal reflection type integrator 20 which is conjugate therewith. Accordingly, by varying the opening of the stop D1, the numerical aperture of the illuminating light can be varied, and on the other hand, by varying the opening of the stop D2, only the quantity of light can be varied independently without varying the numerical aperture of the illuminating light.

In FIG. 10, the surface on which the condensing point is formed is given a reference character A1, the surfaces which are in a conjugate relation with the surface A1 are designated by reference characters A2 and A3, and the surfaces which are in a conjugate relation with the surface 0 to be irradiated are denoted by reference characters B1 and B2. As shown in FIG. 10, the surfaces B1 and B2 are both substantially conjugate with the surface 0 to be irradiated, whereas this relation is not always necessary, but where the surfaces B1 and B2 are conjugate with each other, the central rays of a number of light fluxes emerging from the lens elements 50a of the fly-eye type integrator 50 can be made to aim at the center of the exit surface B2 of the hollow polygonal-pillar-like internal reflection type integrator 20 and therefore, the loss of the quantity of light is small, and this is effective to form a more uniform plane light source.

FIG. 11 is a schematic optical path diagram showing a seventh embodiment of the present invention. This seventh embodiment is an illuminating optical device using as a first optical integrator a fly-eye type integrator 60 comprising a plurality of juxtaposed negative lens elements 60b.

By the fly-eye type integrator 60, the parallel light flux from light source means 40 including a laser source is converted into a number of divergent light fluxes equal to the number of the negative lens elements 60b constituting the fly-eye type integrator 60, and the condensing points of a number of virtual images equal to the number of the negative lens elements are formed on the surface A1. In this seventh embodiment, the plurality of condensing points by the fly-eye type integrator 60 are virtual images and therefore, even if the positions at which those virtual images are formed are within the lens, there is no fear that the lens is damaged by the concentration of heat. Therefore, in FIG. 11, the group of condensing points of these virtual images are formed in the incident light side space of the negative lens elements 60b, but where the center thickness of the juxtaposed negative fly-eye lenses is made great to make the joint thereof easy, the group of condensing points of the virtual images may be formed in the negative fly-eye lenses.

In this seventh embodiment, the condensing points by the fly-eye type integrator 60 are virtual images, but they perform a substantially equivalent function when viewed from the viewpoint of the function as the fly-eye type integrator 60. The construction of the subsequent optical system such as relay lenses 21 and 22 and a hollow square-pillar-like internal reflection type integrator 20 as a second optical integrator is the same as the construction of the sixth embodiment shown in FIG. 10. Accordingly, again in the construction of the seventh embodiment shown in FIG. 11, a stop D1 for adjusting the numerical aperture (NA) of the illuminating light can be provided on a surface A3 conjugate with the plane light source A1 between a positive lens 23 and a condenser lens 9, and a stop D2 for adjusting the quantity of light while maintaining the numerical aperture (NA) of the illuminating light constant can be provided near the entrance port A2 of the hollow square-pillar-like internal reflection type integrator 20.

In each of the above-described embodiments, it will result in the simplest construction if the fly-eye type integrator as the first integrator is comprised of lens elements such as plano-convex lenses or plano-concave lenses, but in any case, in order to prevent the quantity of light from being lost by the light being reflected on the side surfaces of the individual lens elements constituting the fly-eye type integrator, it is desirable to endow the entrance surface of each lens element with a positive refractive power. Accordingly, in the case of a construction in which positive lens elements are juxtaposed, it is effective that the positive lens elements have their convex surfaces facing the incident light side. On the other hand, in the case of a construction in which negative lens elements are juxtaposed, it is desirable that the surfaces thereof adjacent to the incidence side be flat surfaces and the surfaces thereof adjacent to the emergence side by concave surfaces having a diverging action. Further, even in the case of negative lens elements, it is effective to construct them into a negative meniscus shape provided with a weak convex surface to endow the surfaces thereof adjacent to the incidence side with some positive lens action.

Now, it is preferable that as in the third to seventh embodiments described above, a read or virtual light source image be formed near the entrance surface of the square-pillar-like internal reflection type integrator 10, 20, and if the position of the real light source image is made coincident with the entrance surface of the square-pillar-like internal reflection type integrator 10, 20, it will be possible to make the aperture of the internal reflection type integrator smallest. However, where as in the fourth and seventh embodiments, the square-pillar-like internal reflection type integrator 10 comprising a transparent glass rod is used as the second optical integrator, the real images of the group of real condensing points by the first integrator 10 are formed on the entrance surface of the integrator 10 through the relay lenses 21 and 22 and therefore, there is the fear that the square-pillar-like internal reflection type integrator 10 is destroyed by the condensing heat of the real images. In such a case, it will be effective to dispose the images of the group of condensing points in some deviated relationship with the entrance surface 10a, as shown in FIG. 3, or to make the entrance surface concave so as to act as a negative lens, and form a virtual condensing point near the entrance surface.

The shape of the hollow square-pillar-like internal reflection type integrator 20 is not limited to the completely pillar-like shape as shown in FIG. 12, but may be somewhat tapered to thereby change the widening angle (the numerical aperture: NA) of the emergent light flux. That is, by constructing the inner surface of the internal reflection type integrator so as to narrow toward the emergence side of the light flux, the numerical aperture (NA) of the emergent light flux can be made great, and conversely, by constructing the inner surface of the internal reflection type integrator so as to widen toward the emergence side of the light flux, it is possible to make the numerical aperture (NA) of the emergent light flux small. Also, where as shown in FIG. 2, the internal reflection type integrator is a non-hollow transparent glass rod, it is also possible to suitably endow the entrance surface 10a or the exit surface 10b with a lens action.

Also, in the sixth and seventh embodiments, a square pillar of square cross-sectional shape is used as the internal reflection type integrator, whereas this is not restrictive, but the cross-sectional shape of such integrator may be a triangle, a regular hexagon or the like.

In the fourth to seventh embodiments in which the laser source 40 is used as the illuminating light source, the light flux from the light source means is collimated and therefore, the light source can be regarded as a substantial point source of light such as a laser, and it is possible to eliminate the lens action on the emergence side heretofore required of the conventional popular fly-eye type integrator, and where the fly-eye type integrator is comprised of juxtaposed positive lenses, it is possible to form the exit surface thereof into a flat surface.

According to the basic construction of the fourth to seventh embodiments, the real or virtual images of the group of condensing points formed by the fly-eye type integrator are formed near the entrance surface of the internal reflection type integrator 10, 20. Where the fly-eye type integrator 50 comprising a plurality of juxtaposed positive lens elements 50a is used as the first optical integrator, design is made such that the plurality of condensing points thereby are formed in the exit side space of the positive lens elements and therefore, there is no fear that the fly-eye type integrator 50 is destroyed by the heat generated at the condensing points. Also, where the fly-eye type integrator 60 comprising a plurality of juxtaposed negative lens elements 60a is used as the first optical integrator, the real images of condensing points are not formed and therefore, it is possible to prevent the fly-eye type integrator from being destroyed by heat.

Moreover, one of the two optical integrators disposed in the illuminating optical path is the square-pillar-like internal reflection type integrator 10, 20 which can be formed of a single member and therefore, the number of parts becomes very small and in spite of a very simple construction, it is possible to accomplish very uniform illumination.

Also, where the illuminating optical device according to the present invention is used in a projection type exposure apparatus, it is effective to adopt a construction in which the surface 0 to be irradiated in each of the above-described embodiments is the surface of a mask (a reticle) and the pattern image of the mask (reticle) is projection-transferred to the surface of a wafer by a projection objective lens, not shown, and cause the image of a substantial plane light source formed by the present invention to be formed on the entrance pupil surface of the projection objective lens.

What is claimed is:

1. An illuminating optical device having an optical integrator capable of receiving a light flux from a light source and substantially forming a plane light source comprising a plurality of light source images and uniformly illuminating an object, including:
   a square-pillar-like internal reflection type integrator having a plurality of reflecting surfaces capable of reflecting the light flux from said light source and forming a plurality of virtual images of said light source on a plane near the entrance surface thereof;
   a fly-eye type integrator comprising a plurality of lens elements receiving the light flux from said light source and capable of forming a plurality of light source images on a plane, said lens elements being juxtaposed in proximity to one another; and
   relay lens means provided between said two integrators so that the exit surface of one of said two integrators which is adjacent to the light source and the entrance surface of the other integrator which is adjacent to the object are substantially conjugate with each other.

2. An illuminating optical device according to claim 1, wherein said two integrators are disposed so that further the entrance surface of said one integrator and the exit surface of said other integrator are substantially conjugate with each other with respect to said relay lens means and said lens elements of said fly-eye type integrator.

3. An illuminating optical device according to claim 2, wherein said internal reflection type integrator is disposed on the light source side, and said relay lens means is designed to direct the light flux emerging from the exit surface of said internal reflection type integrator to said plurality of lens elements of said fly-eye type integrator.

4. An illuminating optical device according to claim 3, further including a condenser lens provided between said fly-eye type integrator and said object and wherein the entrance surface of said fly-eye type integrator is formed at a position substantially conjugate with the exit surface of said internal reflection type integrator with respect to said relay lens means and conjugate with said object with respect to said condenser lens and said lens elements of said fly-eye type integrator.

5. An illuminating optical device according to claim 2, wherein said fly-eye type integrator is disposed on the light source side, and said relay lens means is designed to direct the light flux emerging from the exit surface of said fly-eye type integrator to the entrance surface of said internal reflection type integrator.

6. An illuminating optical device according to claim 3, further including a positive lens provided between said internal reflection type integrator and said object for converging the light flux emerging from the exit surface of said internal reflection type integrator, and a condenser lens for enlarging the light flux converted by said positive lens and wherein said internal reflection type integrator is constructed so that the exit surface thereof lies at a position conjugate with said object with respect to said positive lens and said condenser lens.

7. An illuminating optical device for uniformly illuminating an object, including:
   an illuminating light source;
   a fly-eye type integrator comprising a plurality of lens elements parallel-disposed in proximity to one another and capable of receiving an illuminating light flux from said illuminating light source and forming a plane light source comprising a plurality of light source images;
   a square-pillar-like internal reflection type integrator comprising a plurality of reflecting surfaces capable of reflecting the illuminating light flux from said illuminating light source and forming a plane light source comprising a plurality of light source images;
   a relay lens provided on the illuminating optical path between said fly-eye type integrator and said internal reflection type integrator so that the focus position by the illuminating light flux passing through said fly-eye type integrator and the entrance surface of said internal reflection type integrator are substantially conjugate with each other; and
   projecting optical means for projecting the illuminating light flux from the plane light source comprising the plurality of light source images formed by said fly-eye type integrator and said internal reflection type integrator onto said object.

8. An illuminating optical device according to claim 7, wherein the exit surface of said internal reflection type integrator and the entrance surface of said fly-eye type integrator are formed at positions substantially conjugate with respect to said relay lens.

9. An illuminating optical device according to claim 7, further including condensing means for converging the illuminating light from said illuminating light source and wherein the entrance surface of said internal reflection type integrator is provided near the condensing point of said illuminating light converged by said condensing means, and the entrance surface of said fly-eye type integrator is formed at a position substantially conjugate with the exit surface of said internal reflection type integrator with respect to said relay lens.

10. An illuminating optical device according to claim 9, wherein said projecting optical means includes a field lens provided in proximity to the exit surface of said fly-eye type integrator and a condenser lens for projecting the illuminating light passed through said field lens onto said object, and the entrance surface of said fly-eye type integrator is disposed at a position conjugate with said object with respect to said projecting optical means.

11. An illuminating optical device according to claim 7, further including collimator optical means for converting the illuminating light from said illuminating light source into a parallel light flux and wherein said fly-eye type integrator is provided on the optical path of said parallel light flux from said collimator optical means, and said entrance surface of said internal reflection type integrator is formed at a position substantially conjugate with the exit surface of said fly-eye type integrator with respect to said relay lens.

12. An illuminating optical device according to claim 11, wherein said projecting optical means includes a positive lens for converging the illuminating light emerging from the exit surface of said internal reflection type integrator and a condenser lens for projecting said illuminating light converged by said positive lens onto said object, and the exit surface of said internal reflection type integrator is disposed at a position conjugate with said object with respect to said projecting optical means.

13. An illuminating optical device according to claim 11, wherein said lens elements constituting said fly-eye type integrator are formed so as to have an inter-surface spacing shorter than the focal length of said lens elements.

14. An illuminating optical device for uniformly illuminating an object, including:
   illuminating light source means emitting a collimated light flux;
   a fly-eye type integrator comprising a plurality of lens elements parallel-disposed in proximity to one another and capable of receiving said light flux and forming a plane light source comprising a plurality of light source images in a space outside said lens elements;
   a relay lens provided on the optical path of the illuminating light passed through said fly-eye type integrator;
   an internal reflection type integrator formed into a square-pillar-like shape with a plurality of reflecting surfaces and capable of causing said plurality of light source images formed by said fly-eye type integrator to be reflected by said plurality of reflecting surfaces and further forming them into a plane light source comprising a number of light source images; and
   projecting optical means for projecting the illuminating light flux from the plane light source comprising said number of light source images formed by said fly-eye type integrator and said internal reflection type integrator onto said object.

15. An illuminating optical device according to claim 14, wherein said lens elements constituting said fly-eye type integrator are plano-convex lenses having their convex surfaces facing the incident light side, the inter-surface spacing of said plano-convex lenses is shorter than the rearward focal length of said plano-convex lenses and the rearward focus position of said plano-convex lens is disposed at a position conjugate with the entrance surface of said internal reflection type integrator with respect to said relay lens.

16. An illuminating optical device according to claim 14, wherein said lens elements constituting said fly-eye type integrator are plano-concave lenses having their concave surfaces facing the emergent light side, said plurality of light source images are formed as virtual images at the forward focus position of said plano-concave lenses and the forward focus position of said plano-concave lenses is disposed at a position conjugate with the entrance surface of said internal reflection type integrator with respect to said relay lens.

17. An illuminating optical device according to claim 14, wherein said projecting optical means includes a positive lens for converging the illuminating light emerging from the exit surface of said internal reflection type integrator and a condenser lens for enlarging said illuminating light converged by said positive lens and projecting said converged illuminating light onto said object, and the exit surface of said internal reflection type integrator is disposed at a position conjugate with said object with respect to said projecting optical means.

* * * * *